US012333158B2

(12) United States Patent
Chittilappilly et al.

(10) Patent No.: US 12,333,158 B2
(45) Date of Patent: Jun. 17, 2025

(54) EFFICIENT MEMORY POWER CONTROL OPERATIONS

(71) Applicant: Advanced Micro Devices, Inc., Santa Clara, CA (US)

(72) Inventors: Jean J. Chittilappilly, Maynard, MA (US); Kevin M. Brandl, Austin, TX (US); Michael L. Choate, Georgetown, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 183 days.

(21) Appl. No.: 17/853,393

(22) Filed: Jun. 29, 2022

(65) Prior Publication Data
US 2024/0004560 A1    Jan. 4, 2024

(51) Int. Cl.
*G06F 3/06* (2006.01)

(52) U.S. Cl.
CPC .......... *G06F 3/0625* (2013.01); *G06F 3/0659* (2013.01); *G06F 3/0673* (2013.01)

(58) Field of Classification Search
CPC ..... G06F 3/0625; G06F 3/0659; G06F 3/0673
See application file for complete search history.

(56) References Cited

U.S. PATENT DOCUMENTS

| | | | |
|---|---|---|---|
| 9,053,812 B2 | 6/2015 | Bains | |
| 9,355,702 B2 | 5/2016 | Takizawa | |
| 10,042,700 B2 | 8/2018 | Brandl | |
| 2010/0138684 A1* | 6/2010 | Kim | G06F 1/3225 713/600 |
| 2017/0092350 A1 | 3/2017 | Halbert et al. | |
| 2017/0351450 A1 | 12/2017 | Brandl et al. | |
| 2018/0121124 A1 | 5/2018 | Choi et al. | |
| 2019/0114109 A1* | 4/2019 | Arora | G06F 1/3275 |
| 2021/0117206 A1* | 4/2021 | Shutt | G06F 3/0607 |

OTHER PUBLICATIONS

International Search Report and Written Opinion for International Application No. PCT/US2023/025443, mailed Oct. 4, 2023, 9 pages.

* cited by examiner

*Primary Examiner* — Jason W Blust
(74) *Attorney, Agent, or Firm* — Polansky & Associates, P.L.L.C.; Paul J. Polansky

(57) ABSTRACT

A data processor is adapted to couple to a memory. The data processor includes a memory operation array, a power engine, and an initialization circuit. The memory operation array includes a command portion and a data portion. The power engine has an input for receiving power state change request signals and an output for providing memory operations responsive to instructions stored in the command portion. The initialization circuit populates the data portion such that consecutive memory operations are separated by an amount corresponding to a predetermined minimum timing parameter.

20 Claims, 4 Drawing Sheets

FIG. 4

EFFICIENT MEMORY POWER CONTROL OPERATIONS

BACKGROUND

Modern dynamic random-access memory (DRAM) provides high memory bandwidth by increasing the speed of data transmission on the bus connecting the DRAM and one or more data processors, such as graphics processing units (GPUs), central processing units (CPUs), and the like. DRAM is typically inexpensive and high density, thereby enabling large amounts of DRAM to be integrated per device. Most DRAM chips sold today are compatible with various double data rate (DDR) DRAM standards promulgated by the Joint Electron Devices Engineering Council (JEDEC). Typically, several DDR DRAM chips are combined onto a single printed circuit board substrate to form a memory module that can provide not only relatively high speed but also scalability.

One feature of DDR DRAMs is the use of mode registers as part of their programming interface. In early DDR DRAM versions, the mode registers could only be changed when all banks of the memory were in the idle state. Placing a DDR DRAM into the idle state required all of the banks to be precharged. Thus, there was a significant overhead associated with writing to the mode registers. Later DDR DRAMs, such as LIPDDR4 DRAM, loosened that requirement and allow the mode registers to be written while banks remain active, but after all pending memory accesses have completed.

In early DDR DRAMs, the mode registers were limited to basic parameters of the memory's operation. For example, DDR1 DRAMs only supported two mode registers, known as the "Mode Register" and the "Extended Mode Register". Over time as DDR DRAMs became faster and more complex, they started to include more mode registers to support additional features and device characteristics. For example, some modern DDR DRAMs are able to change operating frequency to allow the memory to support different power states for different system operating conditions. However, with these enhancements, the number of mode registers that must be re-programmed to change power states has grown as well. Moreover, as DDR memory systems have become more complex, including systems with deep memory hierarchies supporting different numbers of channels, ranks, etc., executing a power state change request has required significant overhead in terms of time.

BRIEF DESCRIPTION OF THE DRAWINGS

FIG. 4 illustrates a memory map of the data portion of the memory operation (MOP) array of FIG. 3 according to some embodiments.

Figure 1:
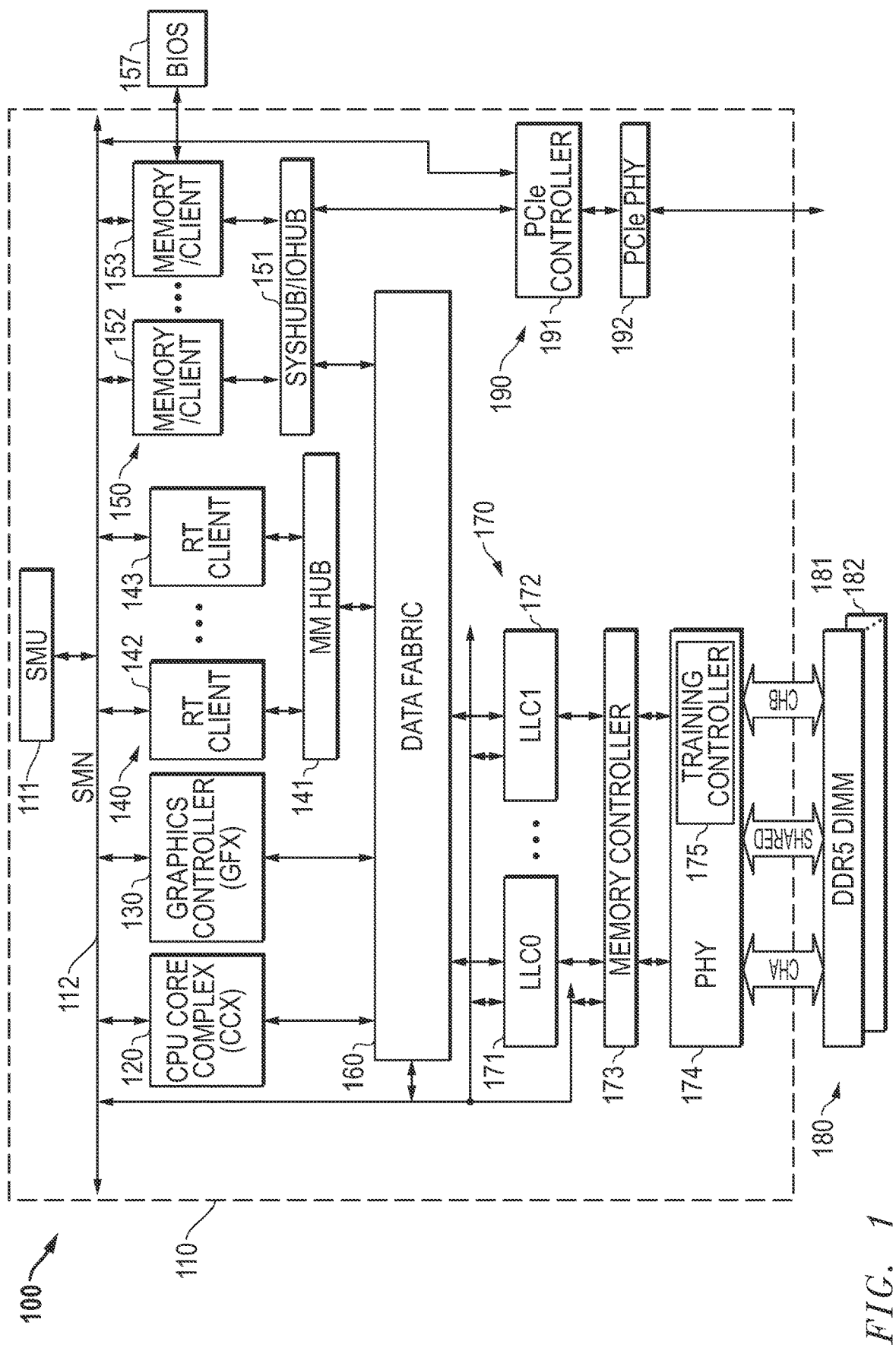
FIG. 1 illustrates in block diagram for a data processing system according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A data processor is adapted to couple to a memory. The data processor includes a memory operation array, a power engine, and an initialization circuit. The memory operation array includes a command portion and a data portion. The power engine has an input for receiving power state change request signals and an output for providing memory operations responsive to instructions stored in the command. The initialization circuit populates the data portion such that consecutive memory operations are separated by an amount corresponding to a predetermined minimum timing parameter.

A data processor is adapted to couple to a memory, and includes a memory operation array, a power engine, and an initialization circuit. The memory operation array includes a command portion and a data portion. The power engine has an input for receiving power state change request signals and an output for providing memory operations. The power engine is responsive to instructions stored in the command portion to generate a plurality of memory operations for programming parameters stored in a sequence in the data portion for entering a selected power state. The initialization circuit is for populating the data portion with a plurality of mode register values for a predetermined power state such that the plurality of mode register values for each region of a plurality of regions of the memory are separated in the sequence by a predetermined number of mode register values that do not access another mode register in a corresponding region.

A method for controlling a memory includes storing a plurality of commands for a first power state in a command portion of a memory operation array, and storing a plurality of parameters for the first power state in a data portion of the memory operation array. A power state change request to the first power state is received. A plurality of memory operations for programming parameters stored in a sequence in the data portion for entering the first power state are generated. Storing the plurality of parameters in the data portion includes populating the data portion such that consecutive memory operations that program different parameters of the same region of the memory in the first power state are separated in the sequence by an amount corresponding to a predetermined minimum timing parameter.

FIG. 1 illustrates in block diagram for a data processing system 100 according to some embodiments. Data processing system 100 includes a data processor in the form of an SOC 110, an external basic input/output system memory 157 labelled "BIOS", and an external memory 180 in the form of a Double Data Rate, version 5, synchronous dynamic random-access memory (DDR5 SDRAM) system. Many other components of an actual data processing system are typically present but are not relevant to understanding the present disclosure and are not shown in FIG. 1 for ease of illustration.

SOC 110 includes generally a system management unit (SMU) 111, a system management network (SMN) 112, a central processing unit (CPU) core complex 120 labelled "CCX", a graphics controller 130 labelled "GFX", a real-time client subsystem 140, a memory/client subsystem 150, a data fabric 160, a memory channel 170 to external memory 180, and a Peripheral Component Interface Express (PCIe)

subsystem 190. As will be appreciated by a person of ordinary skill, SOC 110 may not have all of these elements present in every embodiment and, further, may have additional elements included therein.

SMU 111 is bidirectionally connected to the major components in SOC 110 over SMN 112. SMN 112 forms a control fabric for SOC 110. SMU 111 is a local controller that controls the operation of the resources on SOC 110 and synchronizes communication among them. SMU 111 manages power-up sequencing of the various processors on SOC 110 and controls multiple off-chip devices via reset, enable, and other signals. SMU 111 includes one or more clock sources (not shown), such as a phase locked loop (PLL), to provide clock signals for each of the components of SOC 110. SMU 111 also manages power for the various processors and other functional blocks, and may receive measured power consumption values from CPU cores in CPU core complex 120 and graphics controller 130 to determine appropriate P-states.

CPU core complex 120 includes a set of CPU cores, each of which is bidirectionally connected to SMU 111 over SMN 112. Each CPU core may be a unitary core only sharing a last-level cache with the other CPU cores, or may be combined with some but not all of the other cores in clusters.

Graphics controller 130 is bidirectionally connected to SMU 111 over SMN 112. Graphics controller 130 is a high-performance graphics processing unit capable of performing graphics operations such as vertex processing, fragment processing, shading, texture blending, and the like in a highly integrated and parallel fashion. In order to perform its operations, graphics controller 130 requires periodic access to external memory. In the embodiment shown in FIG. 1, graphics controller 130 shares a common memory subsystem with CPU cores in CPU core complex 120, an architecture known as a unified memory architecture. Because SOC 110 includes both a CPU and a GPU, it is also referred to as an accelerated processing unit (APU).

Real-time client subsystem 140 includes a set of real-time clients such as representative real time clients 142 and 143, and a memory management hub 141 labelled "MM HUB". Each real-time client is bidirectionally connected to SMU 111 over SMN 112, and to memory management hub 141. Real-time client subsystem 140 could include any type of peripheral controller that requires periodic movement of data, such as an image signal processor (ISP), an audio coder-decoder (codec), a display controller that renders and rasterizes objects generated by graphics controller 130 for display on a monitor, and the like.

Memory/client subsystem 150 includes a set of memory elements or peripheral controllers such as memory/client devices 152 and 153, and a system and input/output hub 151 labeled "SYSHUB/IOHUB". Each memory/client device is bidirectionally connected to SMU 111 over SMN 112, and to system and input/output hub 151. Memory/client devices 152 and 153 are circuits that either store data or require access to data on an aperiodic fashion, such as a non-volatile memory, a static random-access memory (SRAM), an external disk controller such as a Serial Advanced Technology Attachment (SATA) interface controller, a universal serial bus (USB) controller, a system management hub, and the like. In SOC 110, memory/client device 153 is adapted to connect to an external memory storing a basic input/output system (BIOS), that is, BIOS memory 157.

Data fabric 160 is an interconnect that controls the flow of traffic in SOC 110. Data fabric 160 is bidirectionally connected to SMU 111 over SMN 112, and is bidirectionally connected to CPU core complex 120, graphics controller 130, memory management hub 141, system and input/output hub 151. Data fabric 160 includes a crossbar switch for routing memory-mapped access requests and responses between any of the various devices of SOC 110.

It includes a system memory map, defined by a basic input/output system (BIOS), for determining destinations of memory accesses based on the system configuration, as well as buffers for each virtual connection.

Memory channel 170 is a circuit that controls the transfer of data to and from external memory 180. Memory channel 170 includes a last-level cache 171 for a first channel labelled "LLC0", a last-level cache 172 for a second channel labelled "LLC1", a memory controller 173, and a physical interface circuit 174 labelled "PHY" connected to external memory system 180. Last-level cache 171 is bidirectionally connected to SMU 111 over SMN 112 and has an upstream port bidirectionally connected to a downstream port of data fabric 160, and a downstream port. Last-level cache 172 is bidirectionally connected to SMU 111 over SMN 112 and has an upstream port bidirectionally connected to a downstream port of data fabric 160, and a downstream port. Memory controller 174 has a first upstream port bidirectionally connected to the downstream port of last-level cache 171, a second upstream port bidirectionally connected to the downstream port of last-level cache 172, and first and second downstream ports. Physical interface circuit 174 has a first upstream port bidirectionally connected to the first downstream port of memory controller 173, a second upstream port bidirectionally connected to the second downstream port of memory controller 173, and a downstream port bidirectionally connected to external memory system 180. As shown in FIG. 1, physical interface circuit 174 includes a training controller 175 whose operation will be described below.

In the illustrated embodiment, external memory system 180 includes a set of DDR5 dual-inline memory modules (DIMMs) including a DIMM 181 and a DIMM 181. Each DIMM includes a set of DDR5 memory chips operating according to the DDR5 standard. In some embodiments, DINMs 181 and 192 are unbuffered DIMMs that support two channels labelled "CHA" and "CHB", as well as multiple ranks on each channel each with multiple memory chips per rank. In one example, each rank can have ten by-four (×4) memory chips in which eight memory chips store data forming a data width of ×32, and two memory chips store error correcting code (ECC) bits for the data. In other embodiments, DIMMs 181 and 182 can be load reduction DIMMs (LRDIMMs) that include a register clock driver and a set of data buffers that buffer and redistribute signals between physical interface circuit 174 and individual memory chips in each of DIMM 181 and DIMM 182.

The bidirectional connection between physical interface circuit 174 and external memory system 180 includes signal groups as defined by the JEDEC DDR5 standard, including separate signals for each channel as well as shared control signals.

In operation, SOC 110 integrates a complex assortment of computing and storage devices, including CPU core complex 120 and graphics controller 130, on a single chip. Most of these controllers are well-known and will not be discussed further. SOC 110 includes multiple internal buses for conducting data between these circuits at high speed. For example, CPU core complex 120 accesses data over a high-speed, 32-bit bus through an upstream port of data fabric 160. Data fabric 160 multiplexes accesses between any of a number of memory accessing agents connected to its upstream ports, and memory accessing responders connected to its downstream ports. Because of the large number of memory accessing agents and memory accessing responders, the number of internal bus lines is quite large as well and a crossbar switch in data fabric 160 multiplexes these wide buses to form virtual connections between the memory access requesters and the memory accessing responders.

The various processing nodes also maintain their own cache hierarchies. In a typical configuration, CPU core complex 120 includes four data processor cores each having its own dedicated level-one (L1) and level two (L2) caches, and having a level three (L3) cache shared between the four CPU cores in the cluster. In this example, last-level caches 171 and 172 would form level four (L4) caches, but regardless of the internal organization of the cache hierarchies in CPU core complex 120, they operate as the last-level caches in the cache hierarchy. In one example, last-level caches 171 and 172 implement inclusive caches, in which any cache line stored in any higher-level cache in SOC 110 will also be stored in them. In another example, last-level caches 171 and 172 are victim cache, and include cache lines each of which contained data that was requested by a data processor at an earlier point in time, but ultimately became the least recently used cache line and was evicted from all upper-level caches.

According to various embodiments to be described here and in further detail below, SOC 110 stores parameters from BIOS memory 157 in a power engine of memory controller 173 to allow it to perform power state change requests for external memory system 180 efficiently. On power-up, a designated CPU core in CPU core complex 120 loads instructions from BIOS memory 157 to start up the system. Among these instructions are instructions that control training controller 175 to determine various timing and voltage parameters in the system. They also include instructions that allow memory controller 173 to efficiently implement memory power state change requests by leveraging the complexity of external memory system 180 to avoid stalling the issuance of mode register commands that a DDR5 memory chip and system uses to change power states. Thus they improve the efficiency of power state change requests compared to known systems.

Figure 2:
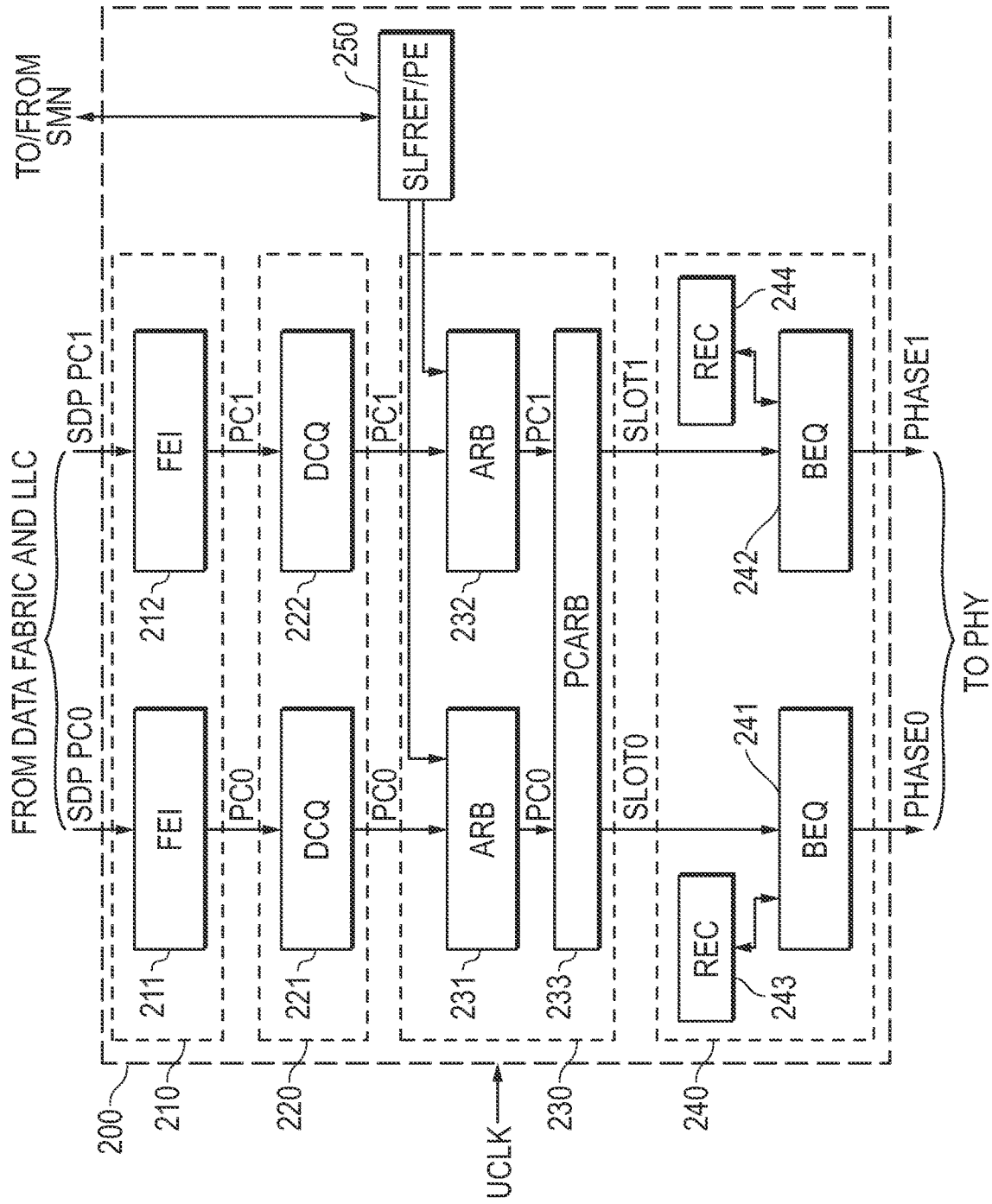
FIG. 2 illustrates in block diagram form a memory controller that can be used as the memory controller of FIG. 1 according to some embodiments.

FIG. 2 illustrates in block diagram form a memory controller 200 that can be used as memory controller 173 of FIG. 1 according to some embodiments. Memory controller 200 includes generally a front-end interface stage 210, a DRAM command queue stage 220, an arbiter stage 230, a back-end queue stage 240, and a self-refresh state machine and power engine 250 labelled "SLFREF/PE".

Front-end interface stage 210 is a circuit that includes front-end interface circuits 211 and 212, each labelled "FEI". Front-end interface circuit 211 has an upstream port connected to the first downstream port of data fabric 160 through last-level cache 171, and a downstream port. In the embodiment of FIG. 2, the upstream port uses an interface known as a scalable data port (SDP) and the upstream port is therefore labelled "SDP PC0", and the downstream port conducts memory access requests for pseudo channel 0 and is therefore labelled "PC0". Front-end interface circuit 212 has an upstream port connected to the second downstream port of data fabric 160 through last-level cache 172 labelled "SDP PC1", and a downstream port labelled "PC1".

DRAM command queue stage 220 is a circuit that includes DRAM command queues 221 and 222, each labelled "DCQ". DRAM command queue 221 has an upstream port connected to the downstream port of front-end interface circuit 211, and a downstream port similarly labelled "PC0". DRAM command queue 222 has an upstream port connected to the downstream port of front-end interface circuit 212, and a downstream port similarly labelled "PC1".

Arbiter stage 230 is a circuit that includes arbiters 231 and 232, each labelled "ARB", and a pseudo-channel arbiter 233 labelled "PCARB". Arbiter 231 has a first upstream port connected to the downstream port of DRAM command queue 221, a second upstream port, and a downstream port similarly labelled "PC0". Arbiter 232 has a first upstream port connected to the downstream port of DRAM command queue 222, a second upstream port, and a downstream port similarly labelled "PC1". Pseudo channel arbiter 233 has a first upstream port connected to the downstream port of arbiter 231, a second upstream port connected to the downstream port of arbiter 232, a first downstream port labelled "SLOT0", and a second downstream port labelled "SLOT1".

Back-end queue stage 240 is a circuit that includes back-end queues 241 and 242 each labelled "BEQ", and command replay queues 243 and 244 each labelled "REC". Back-end queue 241 has a first upstream port connected to the first downstream port of pseudo-channel arbiter 233, a second upstream port, and a downstream port connected to physical interface circuit 174 for providing signals for a first phase labelled "PHASE 0". Back-end queue 242 has a first upstream port connected to the second downstream port of pseudo-channel arbiter 233, a second upstream port, and a downstream port connected to physical interface circuit 174 for providing signals for a second phase labelled "PHASE 1". Command replay queue 243 has a downstream port bidirectionally connected to the second upstream port of back-end queue 241.

Command replay queue 244 has a downstream port bidirectionally connected to the second upstream port of back-end queue 242.

Self-refresh state machine and power engine 250 has a bidirectional connection to SMN 112, a first output connected to the second input of arbiter 231, and a second output connected to the second input of arbiter 232. Self-refresh state machine and power engine 250 is a circuit that provides memory commands into the command stream of PC1 or PC2 such as mode register settings for different memory power states. In DDR5 SDRAMs, many settings that affect operation in the selected power states are set through corresponding mode registers. These are well-known from the DDR5 standard published by JEDEC. Because the supported clock frequencies can be very high, for example 3.2 gigahertz (GHz), the settings are important and have different values for each clock frequency.

The parameters can be identified in several different groups according to DDR5 features. The first group is known as the duty-cycle adjuster (DCA) group. When the DDR5 memory chips have a by-four (×4) data width, then fourteen mode registers, MR43, MR44, MR103, MR104, MR105, MR106, MR133, MR134, MR141, MR142, MR149, MR150, MR157, and MR158 need to be re-programmed for a power state change. That number increases to twenty-two mode registers when the memory chips have a by-eight (×8) data width, and forty-two registers when the DDR5 memory chips have a by-sixteen (×16) data width. There are several other mode register groups related to the decision-feedback-equalizer (DFE) input signal architecture, including groups for each of four DFE taps, a group for the DFE gain enable, and a group for data mask enables. The total number of registers whose settings need to be changed based for different operating frequencies is 39 for ×4 organizations, 67 for ×8 organizations, and 132 for ×16 organizations.

Memory controller 173, however, must observe the timing parameter $t_{MRW}$ when updating mode register values during a power state change. $t_{MRW}$ is the mode register set command delay and defines the minimum amount of time between the mode register set command by which the parameters are loaded into the mode registers in the accessed memory and any other command, including another mode register set command. For example, in the base DDR5 specification published by JEDEC, JESD79-5 (July 2020), $t_{MRW}$ is equal to 8 CK cycles or 5 nanoseconds (ns), whichever is greater. To program one ×16 memory chip for a new speed setting, therefore, would require a minimum of 132×10=1320 CK cycles. To program multiple ranks, the delay increases correspondingly.

Figure 3:
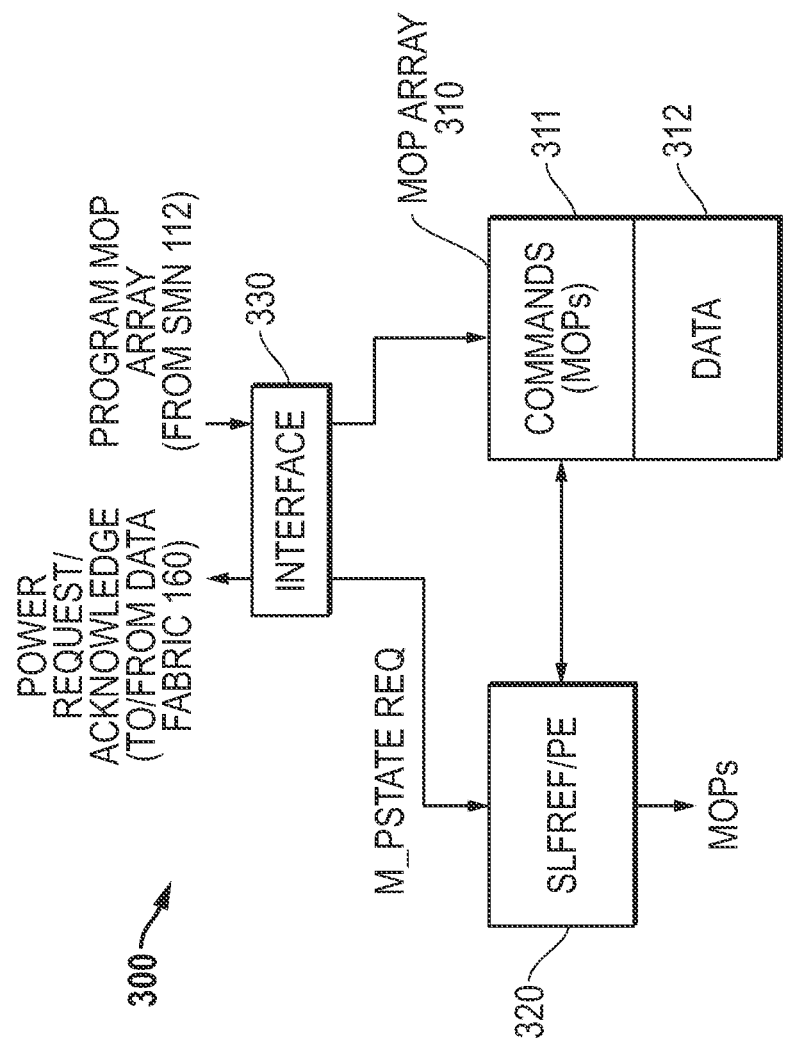
FIG. 3 illustrates in block diagram form a self-refresh state machine and power engine 300 that may be used as the self-refresh state machine and power engine of FIG. 2 according to some embodiments.

FIG. 3 illustrates in block diagram form a self-refresh state machine and power engine 300 that may be used as the self-refresh state machine and power engine 250 of FIG. 2 according to some embodiments. Self-refresh state machine and power engine 300 includes generally a memory operation (MOP) array 310, a power engine 320, and an interface circuit 330 that connects self-refresh state machine and power engine 300 to data fabric 160 to receive power state change commands and to system management network 112 for receipt of data to be programmed into MOP array 310. Interface circuit 330 has a first port bidirectionally connected to data fabric 160 as described above, and as shown in pertinent detail here has an input for receiving a power state change request signal labeled "POWER REQUEST" from data fabric 160, and an output for providing a power state change acknowledge signal labeled "POWER ACKNOWLEDGE" to data fabric 160, and a second port for receiving data to program MOP array 310 labelled "PROGRAM MOP ARRAY" from SMU 111 over SMN 112. Interface circuit 330 also has a second port with an output for providing a memory power state change request signal labeled "M_PSTATE REQ", and a second output for providing data for storage in MOP array 310. Power engine 320 has an input connected to the first output of the second port of interface circuit 330, a bidirectional port, and an output for providing decoded MOPs to BEQ 514. MOP array 310 has an input connected to the second output of the second port of interface circuit 330, and a bidirectional connection to power engine 320, and is divided into a command portion 311 for storing MOPs, and a data portion 312 for storing data.

On startup, the BIOS stored in BIOS memory 157 queries external memory system 180 to determine the type of memory that has been installed and its organization. It typically does so by reading a small non-volatile memory chip on each DIMM present in the system. In the illustrated embodiment, the PHY is configured to support DDR5 memory. In response to detecting the type and capabilities of memory installed in external memory system 180 and performing training using training controller 175, the system BIOS populates MOP array 310. MOP array 310 is programmed with a sequence of commands that initiate entry into and exit from supported low power modes for the particular type of memory in command portion 311, with values obtained during calibration in data portion 312. As will be explained below, it does so by providing commands for writing to the mode registers of the DDR5 memory chips in an efficient order to reduce or eliminate channel stalling based on timing requirements.

In the illustrated embodiment, memory controller 173 operates according to the model described by the Advanced Configuration and Power Interface (ACPI) Specification. It supports various power states (e.g., P0, P1, P2, and P3) in the working (or D0) state of the memory, as well as various low power states (e.g., the D1, D2, and D3 states). According to the ACPI Specification, the working state of a device (such as memory controller 173 or memory system 180) is known as the D0 or "fully on" state. The other states are low power states and include the D1, D2, and D3 states, in which the D3 state is the "off" state. Memory controller 173 is capable of making frequency and/or voltage changes within the D0 state and corresponding changes to the memory chips to operate at the speed corresponding to the selected P-state. It also controls placing external memory system 180 into lower power states corresponding to the available D states of memory controller 173.

Upon receipt of a POWER REQUEST, interface circuit 330 provides the M_PSTATE REQ signal to power engine 320 to indicate which power state is requested. In response, power engine 320 accesses MOP array 310 to execute a sequence of MOPs that place the memory chips in the appropriate states for the requested D state, and in particular, the appropriate power-state (P-state) within the D0 state. Power engine 320 outputs indexes into command portion 311 of MOP array 310, and MOP array 310 returns encoded commands (MOPs) in response. In one example, power engine 320 decodes and issues MOPs linearly from entries in command portion 311 with data from data portion 312, with no branching, until the first null entry is read from command portion 311. Many of these commands are mode register set (MRS) commands that use data values stored in data portion 312. For example, these data values can be specific settings for the large set of DDR5 mode registers that need to be programmed for the particular selected power state.

However instead of programming mode registers one at a time for each rank of memory and each channel, the BIOS in BIOS memory 157 stores a sequence of commands in MOP array 310 in an order such that consecutive memory operations that program different parameters of the same region of the memory in the selected power state are separated in the sequence by an amount corresponding to a predetermined minimum timing parameter. In the case of DDR5, for example, this predetermined minimum timing parameter is $t_{MRW}$.

For example, to guarantee that the commands exhibit this behavior and therefore can be programmed efficiently during power state change requests, the commands iterate in the hierarchical order of device, mode register, channel, and chip select. Assuming there are a sufficient number of devices and chip selects in the system to avoid stalling based on $t_{MRW}$, then power engine 320 can iterate across the whole memory system without stalling. Expressed alternatively, power engine 320 reduces the amount of stalling, if any, in a given system caused by waiting for $t_{MRW}$ to expire, and thereby provides efficient and quick memory power state changes.

Figure 4:
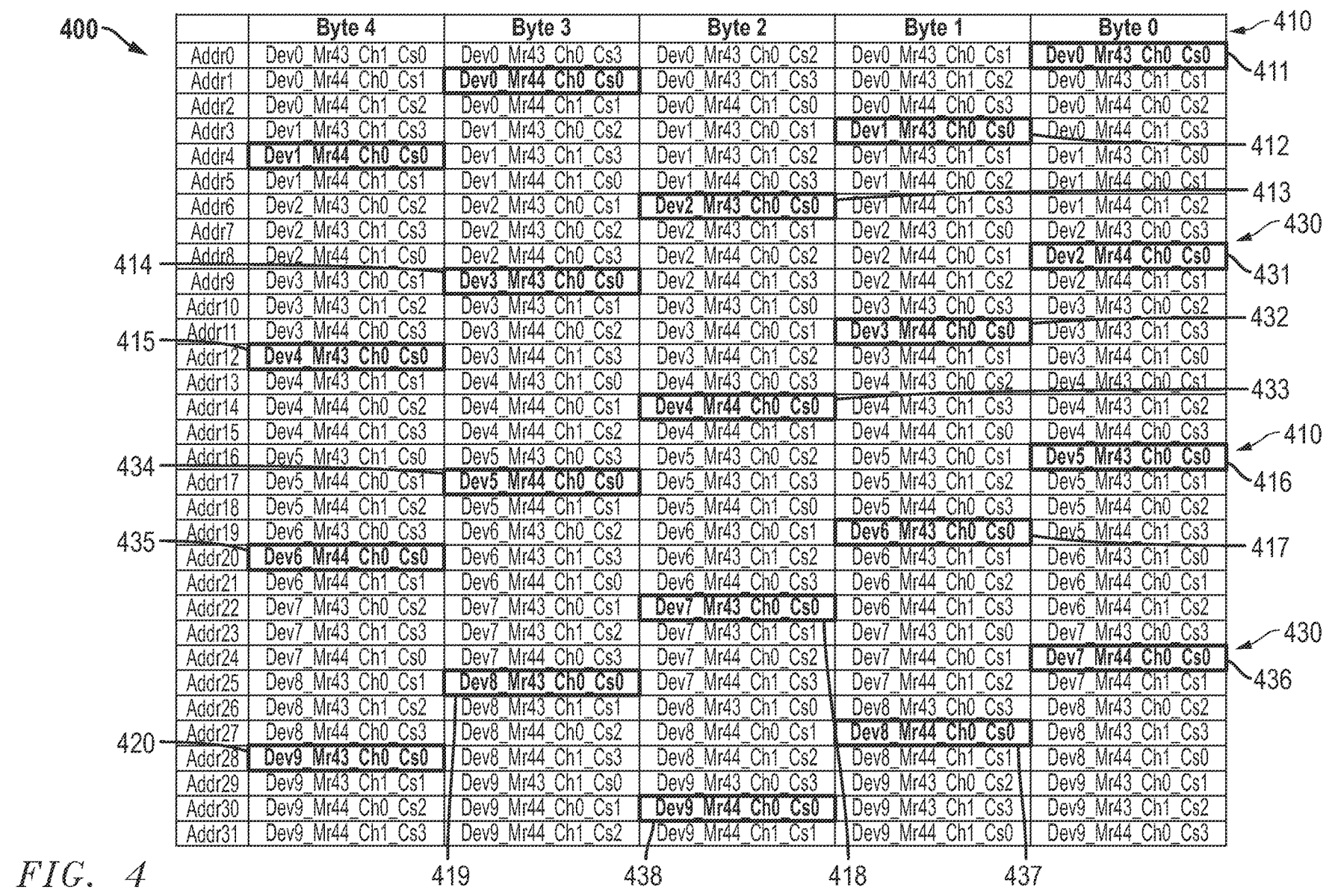

FIG. 4 illustrates a memory map 400 of data portion 312 of MOP array 310 of FIG. 3 according to some embodiments. As shown in FIG. 4, memory map 400 includes 32 rows having an address ranging from a first address labelled "Addr0" to a last address labelled "Addr31". Each row has 40 bits organized as 5 bytes labelled "Byte 0" through "Byte 4" in which each byte includes mode register data corresponding to the 8-bit DDR5 mode registers to allow command portion 311 to generate separate mode register set commands to the memory using the data stored in data portion 312. In particular, command portion 311 indexes each byte according to a corresponding device, a corresponding mode register of that device, a corresponding channel, and a corresponding rank/chip select. For example, Byte 0 of Addr 0 in data portion 312 corresponds to Device 0, Mode Register 43 (MR43), Channel 0, and Rank 0.

Memory map 400 shows the relatively simple example of a system having ten devices labelled "Dev0" through "Dev9" and indexing through only two mode registers, including MR43 and MR44. The system also includes two channels, Ch0 and Ch1 with four ranks/chip selects Cs0, Cs1, Cs2, and Cs3.

Byte 0 of Addr 0 represents the starting location of a set of commands to program entry into a particular power state. When making a power state change request into this power state, command portion 311 would direct power engine 320 to access MR43 of device 0, starting with channel 0 and rank/chip select 0 as shown in Byte 0, Addr0 (byte 411). Before addressing device 0, command portion 311 executes a command to allow it to access only device 0. This command is a multi-purpose command (MPC) known as a per DRAM addressability (PDA). Command portion 311 executes this command before the command corresponding to byte 411 and since it has no associated data, it does not have a corresponding entry in memory map 400. Bytes 1, 2, and 3 of Addr0 increment the rank/chip select in the order of Cs1, Cs2, and Cs3, respectively. Byte 4 of Addr0 returns to Cs0 and increments the channel to Cs1, incrementing in sequence through Cs0, Cs1, Cs2, and Cs3 until in Byte 2 of Addr1, the values finish iterating through all ranks/chip selects and channels. In Byte 3 of Addr1, the mode register changes to MR44.

In DDR5, each mode register set command is a sequence of two commands over two CK cycles. Thus, iterating in this order takes 8×2=16 CK cycles, meeting the minimum $t_{MRW}$ of 16 CK cycles and allowing the next mode register, MR44, to be set in the same physical memory chip without violating $t_{MRW}$.

From Byte 3 of Addr 1 through Byte 1 of Addr 3, MR43 and MR44 are programmed on Dev0 of all channels and ranks of the system. This pattern starts again at byte 412, i.e., Byte 1 of Addr3 for the next device, Dev1. Before byte 412, command portion 411 executes a PDA command to allow it to only address Dev1. The operation proceeds from Dev0 through Dev 9, i.e., to cover all ten devices in the memory system as shown by bytes 431-438, but finishes all mode register accesses for a particular device to improve efficiency because of the overhead of the PDA command.

The particular example shown in FIG. 4 covers only two exemplary mode registers, MR43 and MR44, that are re-programmed for operation in different power states. As noted above, the actual number of mode registers that need to be programmed for a power state change of a DDR5 memory is much larger, and the programming pattern shown in FIG. 4 would change correspondingly.

The instructions stored in command portion 311 cause power engine 320 to perform these iterations and to index through all the mode registers, avoiding delays caused by the tzaw parameter. Moreover, the encoding of the mode register data with the command portion is efficient and compact in terms of size and therefore overall circuit area.

A data processor, memory controller, portions thereof described herein can be embodied one or more circuits, any of which may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, while this technique was illustrated with respect to DDR5 memory, it may be applied to other memory types or other DDR versions that use mode registers that are programmed for operation at different speeds. The technique described above is applicable to systems that have only a single rank and/or a single channel. Moreover, the size and organization of the command portion and/or the data portion of the MOP array can vary in other embodiments.

Accordingly, it is intended by the appended claims to cover all modifications of the disclosed embodiments that fall within the scope of the disclosed embodiments.

What is claimed is:

1. A data processor adapted to couple to a memory, comprising:
  a memory operation array comprising a command portion and a data portion;
  a power engine having an input for receiving power state change request signals and an output for providing memory operations responsive to instructions stored in said command portion; and
  an initialization circuit for populating said data portion with a plurality of mode register values for a predetermined power state for each of a predetermined number of memory devices,
  wherein the power engine is configured to:
    program a first mode register of a first memory device with a first value in a first location of the memory operation array;
    then program the first mode register of at least one other memory device using a corresponding value in one or more corresponding locations of the memory operation array after the first location in a sequence; and
    then program a second mode register of the first memory device using a second value in a second location after the one or more corresponding locations of the memory operation array.

2. The data processor of claim 1, wherein said power engine is responsive to instructions stored in said command portion to generate a plurality of memory operations for programming parameters stored in a sequence in said data portion for entering a selected power state.

3. The data processor of claim 2, wherein said initialization circuit further populates said data portion such that consecutive memory operations that program different parameters of the same region of the memory in said selected power state are separated in said sequence by a number of intervening mode register operations corresponding to a predetermined minimum timing parameter.

4. The data processor of claim 1, wherein each region of a plurality of regions of the memory comprises one or more of: a device, a channel, and a rank.

5. The data processor of claim 1 3, wherein the data processor is adapted to couple to a double data rate (DDR) memory and the predetermined minimum timing parameter is a mode register set to mode register set command cycle time.

6. The data processor of claim 1, wherein said initialization circuit comprises:
 a data processor core;
 a basic input/output system memory; and
 a training controller,
 wherein instructions stored in said basic input/output system memory cause said data processor core to initiate a training operation of the memory using said training controller, and to populate said data portion in response to said training operation and a configuration of the memory.

7. The data processor of claim 1, wherein said initialization circuit further populates said data portion with parameters for at least one additional power state such that consecutive memory operations for said at least one additional power state are separated by a number of intervening mode register operations corresponding to a predetermined minimum timing parameter.

8. The data processor of claim 1, wherein the at least one other memory device comprises a plurality of other memory devices large enough in number such that a time between programming the first and second mode registers of the first memory device is sufficient to satisfy a minimum required time between mode register writes for a memory device.

9. The data processor of claim 1, wherein said memory operation array has a plurality of rows each having a predetermined width, wherein each row in said command portion corresponds to a command of said power engine, and each row of said data portion stores a plurality of parameters for a corresponding mode register set command.

10. A data processor adapted to couple to a memory, comprising:
 a memory operation array comprising a command portion and a data portion;
 a power engine having an input for receiving power state change request signals and an output for providing memory operations, wherein said power engine is responsive to instructions stored in said command portion to generate a plurality of memory operations for programming parameters stored in a sequence in said data portion for entering a selected power state; and
 an initialization circuit for populating said data portion with a plurality of mode register values for a predetermined power for each of a predetermined number of memory devices,
 wherein the power engine is configured to:
  program a first mode register of a first memory device with a first value in a first location of the memory operation array;
  then program the first mode register of at least one other memory device using a corresponding value in one or more corresponding locations of the memory operation array after the first location in the sequence; and
  then program a second mode register of the first memory device using a second value in a second location after the one or more corresponding locations of the memory operation array.

11. The data processor of claim 10, wherein each region of a plurality of regions of the memory comprises one or more of: a device, a channel, and a rank.

12. The data processor of claim 10, wherein the data processor is adapted to couple to a double data rate (DDR) memory.

13. The data processor of claim 10, wherein said initialization circuit comprises:
 a data processor core;
 a basic input/output system memory; and
 a training controller,
 wherein instructions stored in said basic input/output system memory cause said data processor core to initiate a training operation of the memory using said training controller, and to populate said data portion in response to said training operation and a configuration of the memory.

14. The data processor of claim 10, wherein said initialization circuit further populates said data portion with parameters for at least one additional power state such that consecutive memory operations for said at least one additional power state are separated by a number of intervening mode register operations corresponding to a predetermined minimum timing parameter.

15. The data processor of claim 10, wherein the at least one other memory device comprises a plurality of other memory devices large enough in number such that a time between programming the first and second mode registers of the first memory device is sufficient to satisfy a minimum required time between mode register writes for a memory device.

16. The data processor of claim 10, wherein said memory operation array has a plurality of rows each having a predetermined width, wherein each row in said command portion corresponds to a command of said power engine, and each row of said data portion stores a plurality of parameters for a corresponding mode register set command.

17. A method for controlling a memory, comprising:
 storing a plurality of commands for a first power state in a command portion of a memory operation array;
 storing a plurality of parameters for said first power state in a data portion of said memory operation array;
 receiving a power state change request to said first power state;
 generating a plurality of memory operations for programming parameters stored in a sequence in said data portion for entering said first power state; and
 wherein said storing said plurality of parameters in said data portion comprises:
  programming a first mode register of a first memory device with a first value in a first location of the memory operation array;
  then programming the first mode register of at least one other memory device using a corresponding value in one or more corresponding locations of the memory operation array after the first location in the sequence; and
  then programming a second mode register of the first memory device using a second value in a second location after the one or more corresponding locations of the memory operation array.

18. The method of claim 17, wherein each region of a plurality of regions comprises one or more of: a device, a channel, and a rank.

19. The method of claim 17, further comprising:
  determining said plurality of parameters in response to training the memory.

20. The method of claim 17, wherein the at least one other memory device comprises a plurality of other memory devices large enough in number such that a time between programming the first and second mode registers of the first memory device is sufficient to satisfy a minimum required time between mode register writes for a memory device.

\* \* \* \* \*